United States Patent
Sun et al.

(10) Patent No.: US 10,921,624 B2
(45) Date of Patent: Feb. 16, 2021

(54) DISPLAY PANEL AND METHOD FOR MANUFACTURING THE SAME

(71) Applicants: BOE Technology Group Co., Ltd., Beijing (CN); Ordos Yuansheng Optoelectronics Co., Ltd., Inner Mongolia (CN)

(72) Inventors: Shicheng Sun, Beijing (CN); Zhiqiang Wang, Beijing (CN); Peirong Huo, Beijing (CN); Jianfei Tian, Beijing (CN); Delong Zhong, Beijing (CN); Shuang Hu, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 68 days.

(21) Appl. No.: 16/159,358

(22) Filed: Oct. 12, 2018

(65) Prior Publication Data
US 2019/0285922 A1    Sep. 19, 2019

(30) Foreign Application Priority Data
Mar. 15, 2018   (CN) .......................... 2018 1 0216570

(51) Int. Cl.
*G02F 1/133*   (2006.01)
*G02F 1/1335*  (2006.01)
(Continued)

(52) U.S. Cl.
CPC .... *G02F 1/13318* (2013.01); *G02F 1/133512* (2013.01); *G02F 1/133603* (2013.01);
(Continued)

(58) Field of Classification Search
None
See application file for complete search history.

(56) References Cited

U.S. PATENT DOCUMENTS

| 8,947,627 | B2 * | 2/2015 | Rappoport | G06F 3/011 |
| | | | | 349/151 |
| 2002/0140876 | A1 * | 10/2002 | Yoo | G02F 1/136213 |
| | | | | 349/38 |

(Continued)

FOREIGN PATENT DOCUMENTS

| CN | 104699326 A | 6/2015 |
| CN | 105009042 A | 10/2015 |
| CN | 105334659 A | 2/2016 |

OTHER PUBLICATIONS

Office Action issued in corresponding Chinese Patent Application No. 201810216570.2, dated Aug. 3, 2020.

*Primary Examiner* — Edward J Glick
*Assistant Examiner* — David Y Chung
(74) *Attorney, Agent, or Firm* — McDermott Will & Emery LLP

(57) ABSTRACT

The present disclosure relates to a display panel and a method for manufacturing the same. The display panel includes an infrared receiver. The infrared receiver is disposed on a substrate and is located on one side of the substrate which is close to a light emitting surface, wherein the infrared receiver is configured to receive infrared light incident through the light emitting surface.

7 Claims, 5 Drawing Sheets

(51) Int. Cl.
*G02F 1/13357* (2006.01)
*H01L 27/12* (2006.01)
*H01L 27/15* (2006.01)
*H01L 27/32* (2006.01)
*H01L 31/16* (2006.01)
*H03K 17/945* (2006.01)

(52) U.S. Cl.
CPC ...... *H01L 27/1218* (2013.01); *H01L 27/1262* (2013.01); *H01L 27/156* (2013.01); *H01L 27/3227* (2013.01); *H01L 27/3244* (2013.01); *H01L 27/3272* (2013.01); *H01L 31/165* (2013.01); *H03K 17/945* (2013.01); *H01L 2227/323* (2013.01)

(56) References Cited

U.S. PATENT DOCUMENTS

| | | | |
|---|---|---|---|
| 2012/0169962 A1* | 7/2012 | Yuki | G01J 1/02 349/61 |
| 2015/0370359 A1 | 12/2015 | Lim et al. | |
| 2017/0153475 A1 | 6/2017 | Li et al. | |

* cited by examiner

DISPLAY PANEL AND METHOD FOR MANUFACTURING THE SAME

CROSS-REFERENCE TO RELATED APPLICATION(S)

This application claims priority to the Chinese Patent Application No. CN201810216570.2, filed on Mar. 15, 2018, entitled "DISPLAY PANEL AND METHOD FOR MANUFACTURING THE SAME", which is incorporated herein by reference in its entirety.

TECHNICAL FIELD

The present disclosure relates to the field of display, and more particularly, to a display panel and a method for manufacturing the same.

BACKGROUND

A proximity sensor on a mobile phone may be used to detect proximity between a user's body and a handset of the mobile phone, so that the mobile phone may control wake-up and blanking of a screen based on the proximity. A conventional proximity sensor of a mobile phone is designed as a separate module, which occupies a large structural design space and is not advantageous to realize design of a narrow bezel on a screen of the mobile phone.

SUMMARY

The present disclosure proposes a display panel and a method for manufacturing the same.

According to an aspect of the present disclosure, there is provided a display panel. The display panel comprises an infrared receiver. The infrared receiver is disposed on a substrate and is located on one side of the substrate which is close to a light emitting surface, wherein the infrared receiver is configured to receive infrared light incident through the light emitting surface.

In some embodiments, the infrared receiver is a photodiode having a PN junction structure and is arranged in the same layer as one of layers of a Thin Film Transistor (TFT) array.

In some embodiments, the infrared receiver is arranged in the same layer as a gate insulating layer in the TFT array.

In some embodiments, the display panel further comprises: an infrared emitter configured to emit infrared light which will exit through the light emitting surface.

In some embodiments, the display panel is a liquid crystal display panel, and the infrared emitter is located in a backlight module of the display panel.

In some embodiments, a light-passing hole is formed in at least one of various layers between the infrared receiver and the light emitting surface, and an orthographic projection of the light-passing hole on the substrate at least partially overlaps with an orthographic projection of the infrared receiver on the substrate.

In some embodiments, a light-passing hole is formed in at least one of various layers between the infrared emitter and the light emitting surface, and an orthographic projection of the light-passing hole on the substrate at least partially overlaps with an orthographic projection of the infrared emitter on the substrate.

In some embodiments, the infrared receiver is arranged in a single layer region on the substrate.

In some embodiments, the display panel further comprises: a light shielding layer arranged between the infrared receiver and the substrate.

In some embodiments, the display panel further comprises: a buffer layer arranged between the infrared receiver and the substrate and covering the light shielding layer.

According to another aspect of the present disclosure, there is provided a method for manufacturing a display panel. The method comprises: arranging a substrate; and forming an infrared receiver on the substrate, wherein the infrared receiver is formed on one side of the substrate which is close to a light emitting surface, and is configured to receive infrared light incident through the light emitting surface.

In some embodiments, the step of forming an infrared receiver further comprises: forming a polysilicon layer in a region on the substrate where the infrared receiver is formed; forming at least one of layers of a TFT array on the substrate, wherein the at least one of the layers of the TFT array covers the polysilicon layer; etching a region corresponding to a first half region of the polysilicon layer to remove a film layer with a first thickness which covers the polysilicon layer; injecting holes into the region corresponding to the first half region of the polysilicon layer, so that the injected holes enter the first half region of the polysilicon layer; etching a region corresponding to a second half region of the polysilicon layer to remove a film layer with a second thickness which covers the polysilicon layer; and injecting electrons into the region corresponding to the second half region of the polysilicon layer, so that the injected electrons enter the second half region of the polysilicon layer.

In some embodiments, the remaining TFT array corresponds to a gate insulating layer.

In some embodiments, the method further comprises: arranging an infrared emitter, wherein the infrared emitter is configured to emit infrared light which will exit through the light emitting surface.

In some embodiments, the display panel is a liquid crystal display panel, and the step of arranging the infrared emitter further comprises: arranging the infrared emitter in a backlight module of the display panel.

In some embodiments, the method further comprises: forming a light-passing hole in at least one of various layers between the infrared receiver and the light emitting surface, wherein an orthographic projection of the light-passing hole on the substrate at least partially overlaps with an orthographic projection of the infrared receiver on the substrate.

In some embodiments, the method further comprises: forming a light-passing hole in at least one of various layers between the infrared emitter and the light emitting surface, wherein an orthographic projection of the light-passing hole on the substrate at least partially overlaps with an orthographic projection of the infrared emitter on the substrate.

In some embodiments, the method further comprises: forming the infrared receiver in a single layer region on the substrate.

In some embodiments, the method further comprises: forming a light shielding layer on the substrate, wherein the infrared receiver is formed on the light shielding layer.

In some embodiments, the method further comprises: forming a buffer layer on the substrate, wherein the buffer layer covers the light shielding layer, and the infrared receiver is formed on the buffer layer.

BRIEF DESCRIPTION OF THE DRAWINGS

The accompanying drawings are used to provide a further understanding of the technical solutions of the present disclosure and constitute a part of the specification. The accompanying drawings are used together with the embodiments of the present application to explain the technical solutions of the present disclosure and do not constitute limitations on the technical solutions of the present disclosure.

DETAILED DESCRIPTION

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. It is apparent that the described embodiments are a part of the embodiments of the present disclosure, instead of all the embodiments. All other embodiments obtained by those of ordinary skill in the art based on the described embodiments of the present disclosure without any creative work are within the protection scope of the present disclosure. It should be illustrated that throughout the accompanying drawings, the same elements are represented by the same or similar reference signs. In the following description, some specific embodiments are for illustrative purposes only, and are not to be construed as limiting the present disclosure, but only examples of the embodiments of the present disclosure. Conventional structures or configurations will be omitted when they may cause confusion to the understanding of the present disclosure. It should be illustrated that shapes and sizes of various components in the accompanying drawings do not reflect true sizes and proportions, but merely illustrate contents of the embodiments of the present disclosure.

The infrared receiver according to the present disclosure is a photodiode having a PN junction structure. The PN junction generates photo-generated carriers upon being illuminated by infrared light, wherein the carriers may increase reverse current, which may increase in a certain range as illumination intensity increases. Thereby, proximity between an external object which reflects the infrared light and an electronic device may be determined according to magnitude of the reverse current. In one embodiment of the present disclosure, polysilicon is a body which forms the PN junction of the photodiode, and an infrared receiver capable of receiving infrared light is formed by doping electrons and holes into the PN junction respectively.

The present disclosure will be described in detail below with reference to the accompanying drawings.

Figure 1:
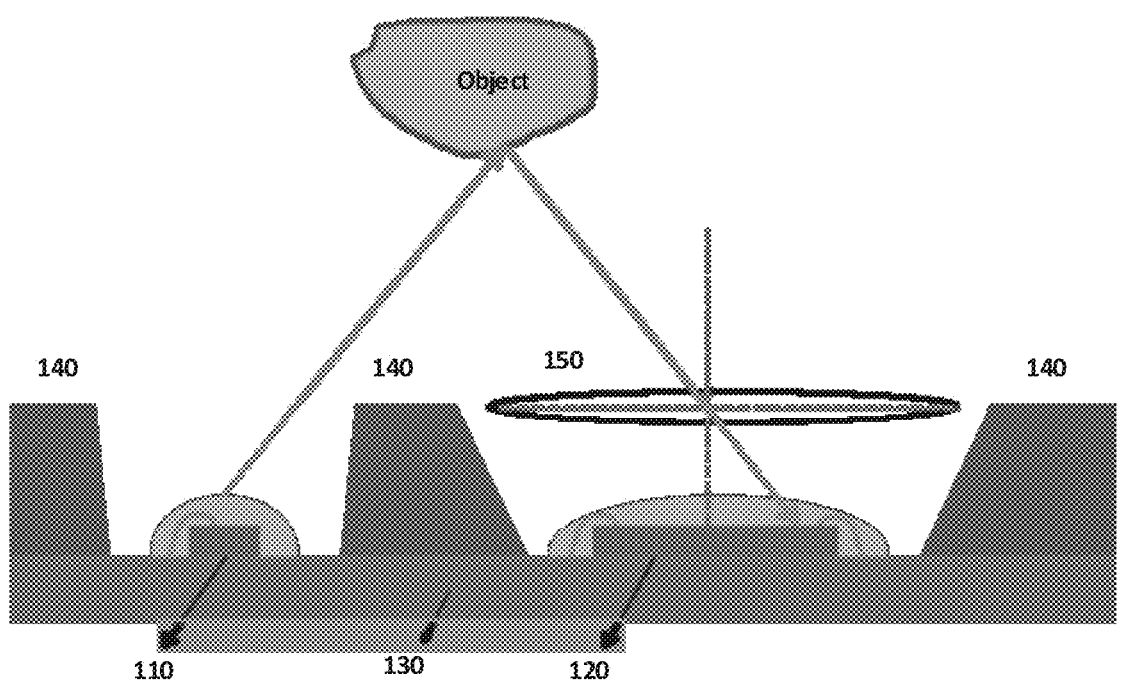
FIG. 1 illustrates a schematic diagram of an arrangement of a conventional proximity sensor on an electronic device.

FIG. 1 illustrates a schematic diagram of an arrangement of a conventional proximity sensor on an electronic device. In the arrangement of the conventional proximity sensor, an infrared emitter and an infrared receiver are mounted as separate electronic modules on, for example, a Printed Circuit Board (PCB) of the electronic device. As shown in FIG. 1, an infrared emitter 110 and an infrared receiver 120 are disposed on a PCB board 130 of the electronic device, and are spaced apart by a stopper 140. A lens 150 is also disposed above the infrared receiver 120. Infrared light emitted from the infrared emitter 110 is reflected from an object close to the electronic device, is transmitted through the lens, and is finally received by the infrared receiver, so that the electronic device may measure proximity between the object and the electronic device. However, this conventional proximity sensor occupies a large structural design space and is not highly integrated with a screen of a mobile phone, which is disadvantageous for design of a narrow bezel of the screen of the mobile phone.

Figure 2:
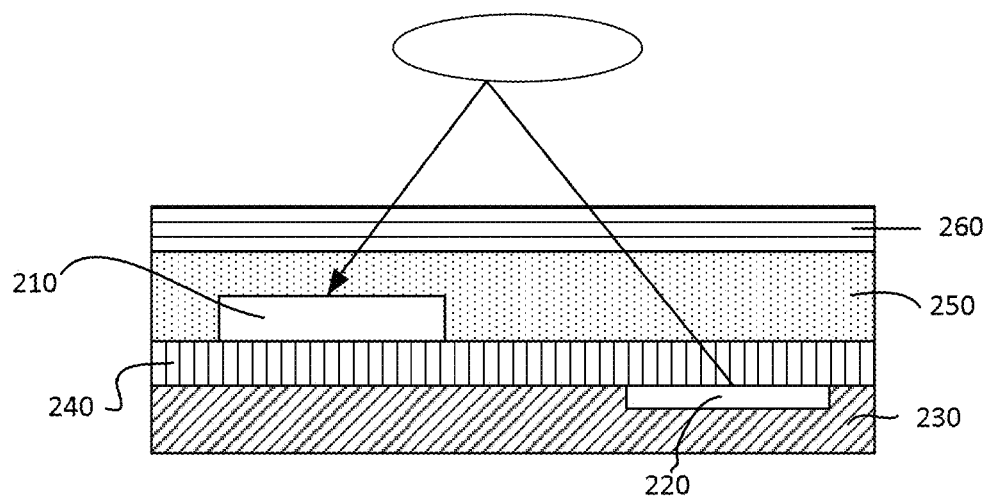
FIG. 2 illustrates a schematic diagram of an arrangement of a proximity sensor on an electronic device according to an embodiment of the present disclosure.

FIG. 2 illustrates a schematic diagram of an arrangement of a proximity sensor on an electronic device according to an embodiment of the present disclosure.

In FIG. 2, a display panel of the electronic device corresponds to a liquid crystal display panel, including a backlight module 230, a substrate 240, a Thin Film Transistor (TFT) array 250, and a cover glass 260. The proximity sensor is composed of an infrared emitter 220 and an infrared receiver 210, wherein the infrared receiver 210 is disposed on the substrate 240 and is located on one side of the substrate 240 which is close to a light emitting surface.

The infrared emitter 220 is located on the other side of the substrate. In one embodiment, the infrared emitter 220 is located in the backlight module 230. Hereinafter, description will be made with reference to a case where the infrared emitter 220 is located in the backlight module 230.

However, it should be understood that in other embodiments of the present application, the infrared emitter 220 may not be located in the backlight module 230, and may even be located on the same side of the substrate as that where the infrared receiver 210 is located (for example, embedded in the cover glass 260), or may also be embedded in the substrate 240, which is not limited here by the present disclosure.

In another embodiment, the infrared emitter 220 may even not be a part of the display panel, for example, the infrared emitter 220 may be a separate component which is detachably mountable on the display panel.

The TFT array 250 (or referred to as a TFT array film layer 250) is a stack structure including a plurality of layers (for example, a gate layer, a gate insulating layer, a source/drain layer, a barrier layer, etc.), and comprises an array composed of multiple TFTs in a matrix form in a display region. Constitution of the stack structure of the TFT array 250 in the display region or a stacking order of various layers is not limited by the present disclosure.

In one embodiment, the infrared receiver 210 is arranged in the same layer as one of the layers of the TFT array 250 (for example, the gate insulating layer). In general, the substrate 240 and the TFT array 250 may be collectively referred to as a TFT array substrate.

Generally, the infrared receiver 210 is not located in the display region of the display panel, and a part of the TFT array 250 surrounding the infrared receiver 210 and a part of the TFT array 250 in the display region may have different layer structures. In an embodiment described below with reference to FIG. 8, the final infrared receiver 210 is formed by doping material (polysilicon) of a body of the infrared receiver 210 after forming the TFT array 250, and the presence of an etching step may result in that the part of the finally formed TFT array 250 surrounding the infrared receiver 210 and the part of the TFT array 250 in the display region have different layer structures.

In FIG. 2, the infrared light emitted by the infrared emitter 220 passes through the substrate 240, the TFT array 250, and the cover glass 260; after being reflected by the external object, passes through the cover glass 260 and the TFT array 250 again; and is finally received by the infrared receiver 210. In order to realize this process, it is necessary to make the substrate 240, the TFT array 250, and the cover glass 260 transparent. For example, the substrate 240 may be made of light transmissive glass, and the part of the TFT array 250 surrounding the infrared receiver 210 may also be formed of a light transmissive material (for example, Indium tin oxide (ITO) etc.)

Figure 5:
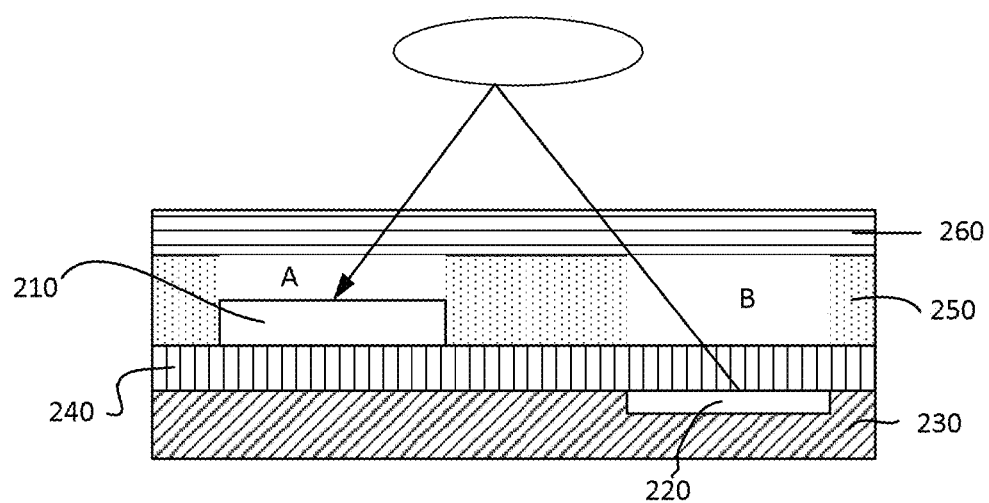
FIG. 5 illustrates a schematic diagram of another arrangement of a proximity sensor on an electronic device according to an embodiment of the present disclosure.

In another embodiment, a light-passing hole through which the infrared light passes may be formed at positions in one or more of the substrate 240, the TFT array 250, and the cover glass 260, which correspond to the infrared emitter 220 and the infrared receiver 210. For example, an orthographic projection of the light-passing hole on the substrate 240 at least partially overlaps with an orthographic projection of the infrared receiver 210 or the infrared emitter 220 on the substrate. As shown in FIG. 5, a light-passing hole through which the infrared light passes are formed in portions A and B of the TFT array 250, which correspond to the infrared receiver 210 and the infrared emitter 220, respectively. The arrangement of the light-passing hole can reduce the limitations on the material used for the TFT array 250, and can increase the transmittance and improve the light-sensing performance as compared with the use of a transparent material. It should be understood that the arrangement of the light-passing hole in FIG. 5 is merely exemplary, and in other embodiments, a light-passing hole through which the infrared light passes may be disposed in one or more of the substrate 240, the TFT array 250, and the cover glass 260 (and other layers not shown) according to the requirements of materials, processes and devices.

In one embodiment, a filter plate is disposed in a region of the cover glass 260 which corresponds to the infrared emitter 220 to filter out light other than infrared light.

Figure 6:
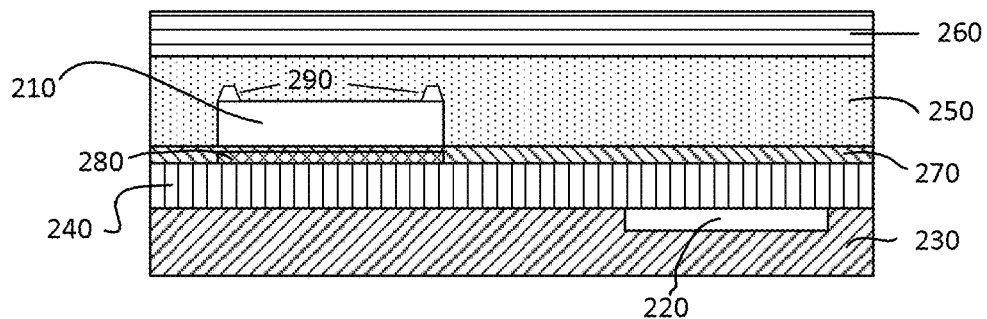
FIG. 6 illustrates a schematic diagram of yet another arrangement of a proximity sensor on an electronic device according to an embodiment of the present disclosure.

FIG. 6 illustrates a schematic diagram of another arrangement of a proximity sensor on an electronic device according to an embodiment of the present disclosure. Unlike FIG. 2, the structure in FIG. 6 further comprises a buffer layer 270, a light shielding layer 280, and a transmission line 290.

The light shielding layer 280 is disposed on the substrate 240. The buffer layer 270 is also disposed on the substrate 240 and covers the light shielding layer 280. The light shielding layer 280 is disposed in correspondence to the infrared receiver 210. The light shielding layer 280 is configured to prevent the infrared light from being illuminated onto the infrared receiver 210 by diffraction in the substrate 240, thereby avoiding occurrence of false alarms. The buffer layer 270 is configured to prevent impurities in the substrate 240 from entering the infrared receiver 210, thereby affecting the light-sensing performance of the infrared receiver 210.

Figure 3:
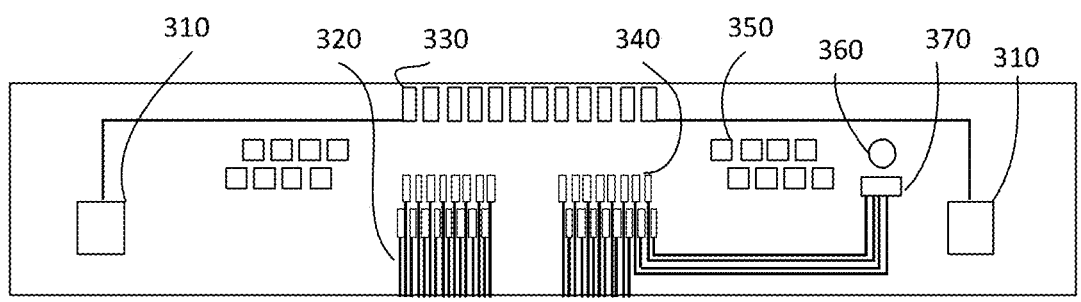
FIG. 3 illustrates a schematic diagram of an arrangement of a proximity sensor in a single layer region of a display panel.

The transmission line 290 is disposed at opposite ends of the infrared receiver 210, so that the opposite ends of the infrared receiver 210 having a PN junction structure may be connected to an Integrated Circuit (IC) (as shown in FIG. 3 below) or to a Flexible Printed Circuit (FPC), so as to apply a reverse bias voltage to the infrared receiver 210. When reverse current increases, a signal is transmitted back to the IC through the transmission line 290, and is output to the entire chip for judgment and processing.

In FIG. 6, the transmission line 290 is disposed on a surface of the infrared receiver 210 to make electrical contact with the infrared receiver 210. In other embodiments, a hole may also be drilled on the surface of the infrared receiver 210, so that the transmission line 290 extends into the infrared receiver 210 to form a better electrical contact.

In the arrangement of FIG. 2 (and FIG. 6), the infrared receiver 210 and the infrared emitter 220 are located in a non-display region (a single layer region as described below) of the display panel, and therefore, there are no structures such as a liquid crystal layer, a black matrix and a color film layer etc. disposed above the non-display region. It should be understood that the structure of the display panel shown in FIG. 2 may comprise other layers, for example, a tape under the cover glass 260 etc.

Specifically, the infrared receiver 210 and the infrared emitter 220 may be located in a single layer region (or referred to as a pad region, a lead region, etc.) of the display panel. In a liquid crystal module of the display panel, pads to be connected to circuits (for example, a driving circuit, etc.) outside the display region may be arranged at positions outside the display region which are in close proximity to an edge of the display region, and the pads are connected to a TFT pixel circuit through leads. As described above, unlike the display region, this region has a substrate arranged thereon, but does not have a film layer such as a color film layer arranged thereon, and thus may be referred to as a "single layer region". It should be understood that a name of the term "single layer region" is only used for the convenience of readers to understand details of the technical solutions of the present disclosure, and does not limit the referred region to have only a single layer structure.

FIG. 3 illustrates a schematic diagram of an arrangement of a proximity sensor in a single layer region of a display panel. It should be understood that the single layer region shown in FIG. 3 corresponds to the substrate 240 and the TFT array 250 (i.e., the TFT array substrate) in FIG. 2 in the layer structure of the display panel.

As shown in FIG. 3, the single layer region of the display panel has a silver paste dot region 310, a fan-out line region 320, a FPC solder bump region 330, an IC solder bump region 340, an electrical test pad region 350, an infrared emitter aperture 360, and an infrared receiver 370 arranged thereon. Here, the IC solder bump region 340 draws leads to the infrared receiver 370 to be connected thereto. The infrared emitter aperture 360 is disposed adjacently to the infrared receiver 370, so that infrared light emitted by the infrared emitter may be emitted from the infrared emitter aperture 360 and may be reflected by an external object back to the infrared receiver 370. In FIG. 3, the infrared emitter aperture 360 and the infrared receiver 370 are arranged between the conventional electrical test pad region 350 and the silver paste dot region 310 without changing a size or a layout of the conventional single layer region, which neither increases the complexity of the production of this part, nor reduces a proportion of the display region of the display panel. It should be understood that the positional relationship illustrated in FIG. 3 is merely exemplary, and in other embodiments of the present disclosure, the infrared emitter aperture 360 and the infrared receiver 370 may also be arranged at other positions in the single layer region, which is not limited here by the present disclosure.

Specifically, the infrared receiver 370 may have a size of, for example, 0.5 mm×1 mm, and the infrared emitter aperture 360 may have a diameter of, for example, 0.7 mm.

Figure 4:
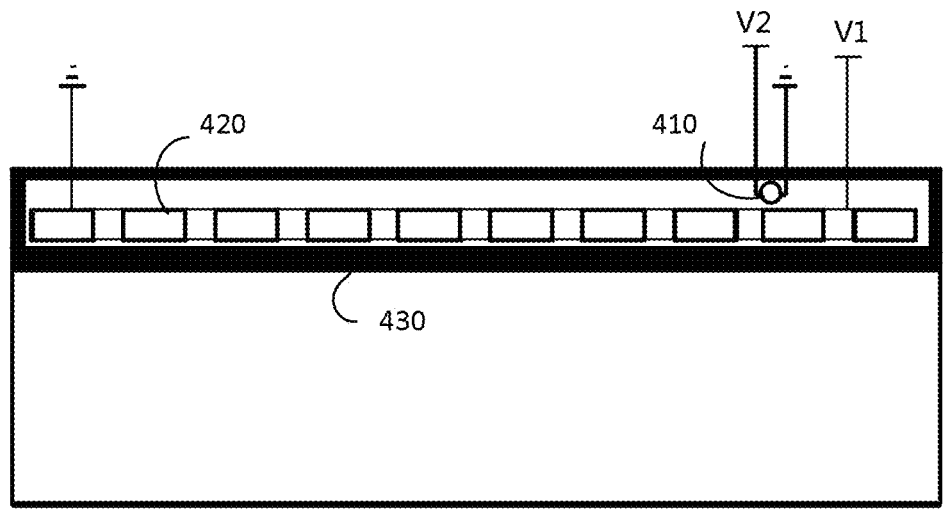
FIG. 4 illustrates a schematic diagram of an arrangement of an infrared emitter in a backlight module which corresponds to a position shown in FIG. 3.

Accordingly, FIG. 4 illustrates a schematic diagram of an arrangement of an infrared emitter in a backlight module, which corresponds to the position shown in FIG. 3. As shown in FIG. 4, in the backlight module, an infrared emitter 410 is arranged adjacently to a backlight LED 420. For example, the infrared emitter 410 may be located in a gap between two adjacent backlight LEDs 420. In FIG. 4, the backlight LED 420 is powered by a power source V1, and the infrared emitter 410 is powered by another power source V2. In other embodiments, the backlight LED 420 and the infrared emitter 410 may be powered by the same power source. A backlight black adhesive strip 430 is also disposed on the backlight module to block diffracted light of light emitted by the backlight LED 420 and the infrared emitter 410.

Specifically, the infrared emitter 410 may have a diameter of, for example, 0.5 mm.

In one embodiment, when the backlight LED 420 and the infrared emitter 410 are powered by different power sources V1 and V2 respectively, the power source V2 which powers the infrared emitter 410 intermittently emits infrared light at a frequency which matches a design frequency of the infrared receiver, wherein an intermittent time is, for example, less than 0.1 ms.

In the technical solutions according to the above embodiments of the present disclosure, the infrared receiver is integrated on the substrate, which can reduce the design space occupied by the infrared receiver, and is advantageous for the design of a narrow bezel. In addition, the infrared emitter is disposed in the backlight module and is arranged adjacently to the backlight LED, which can realize overall power supply design and layout, and can share the backlight black adhesive strip to prevent light diffraction.

Figure 7:
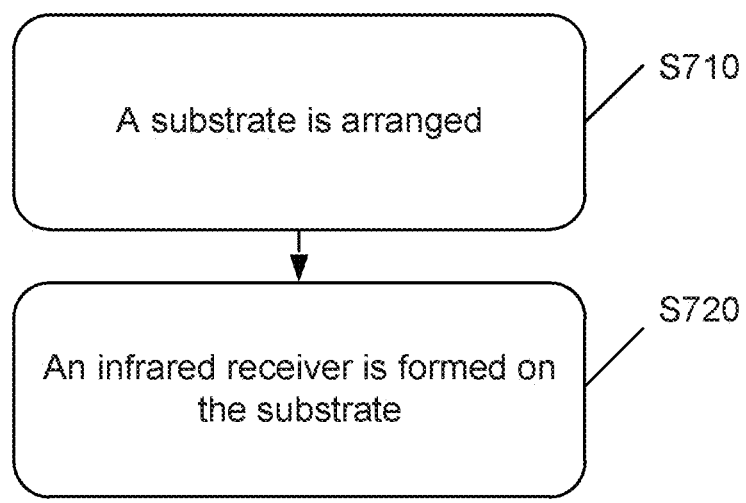
FIG. 7 illustrates a flowchart of a method for manufacturing a display panel according to an embodiment of the present disclosure.

FIG. 7 illustrates a flowchart of a method 700 for manufacturing a display panel according to an embodiment of the present disclosure.

In step S710, a substrate is arranged.

In step S720, an infrared receiver is formed on the substrate.

The infrared receiver is formed on one side of the substrate which is close to a light emitting surface, and can receive infrared light incident through the light emitting surface.

Figure 8:
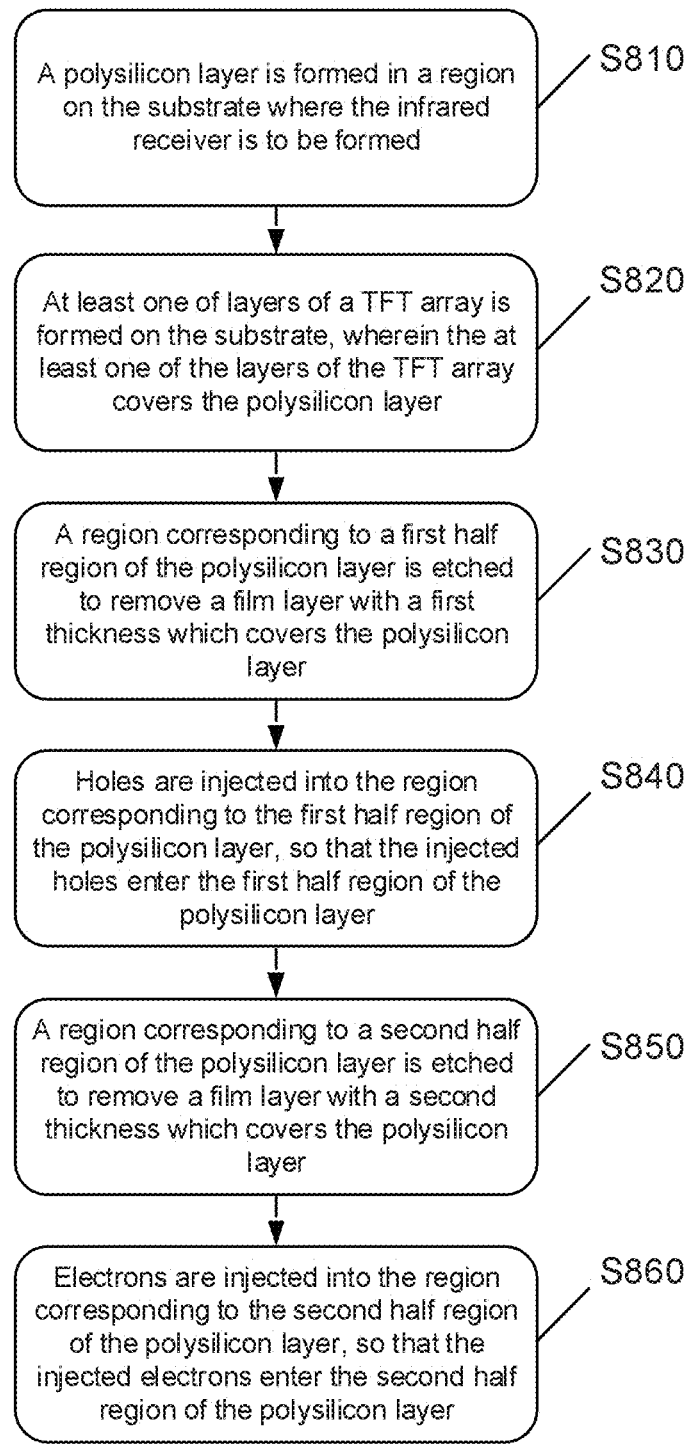
FIG. 8 illustrates a more detailed flowchart of a step of forming an infrared receiver on a substrate in FIG. 7.

In one embodiment, as shown in FIG. 8, step S720 may further comprise the following sub-steps.

In S810, a polysilicon layer is formed in a region on the substrate where the infrared receiver is to be formed.

In S820, at least one of layers of a TFT array is formed on the substrate, wherein the at least one of the layers of the TFT array covers the polysilicon layer.

In S830, a region corresponding to a first half region of the polysilicon layer is etched to remove a film layer with a first thickness which covers the polysilicon layer.

In S840, holes are injected into the region corresponding to the first half region of the polysilicon layer, so that the injected holes enter the first half region of the polysilicon layer.

In S850, a region corresponding to a second half region of the polysilicon layer is etched to remove a film layer with a second thickness which covers the polysilicon layer.

In S860, electrons are injected into the region corresponding to the second half region of the polysilicon layer, so that the injected electrons enter the second half region of the polysilicon layer.

It should be understood that step S720 may comprise more or less sub-steps in other embodiments of the present disclosure, as long as the infrared receiver having a PN junction structure can be manufactured on the substrate. For example, since the sub-steps of performing etching are included in the above sub-steps, sub-steps of coating photoresist and peeling off the photoresist may also be included in the above sub-steps, and the lithography process will not be described here again in the present disclosure.

In one embodiment, the remaining TFT array in the sub-steps of step S720 corresponds to a gate insulating layer. In this embodiment, layers in the TFT film layer which are above the gate insulating layer are etched away, and electrons and holes are doped into polysilicon through the gate insulating layer to form a PN junction structure.

In one embodiment, the first thickness is equal to the second thickness.

In one embodiment, the method 700 further comprises arranging a cover glass on the TFT array.

In one embodiment, the method 700 further comprises: arranging an infrared emitter, wherein the infrared emitter is configured to emit infrared light which will exit through the light emitting surface. Here, in a case where the display panel is a liquid crystal display panel, the infrared emitter may be arranged in a backlight module of the display panel.

In one embodiment, the method 700 further comprises: forming a light-passing hole in at least one of various layers between the infrared receiver and the light emitting surface, wherein an orthographic projection of the light-passing hole on the substrate at least partially overlaps with an orthographic projection of the infrared receiver on the substrate; and forming a light-passing hole in at least one of various layers between the infrared emitter and the light emitting surface, wherein an orthographic projection of the light-passing hole on the substrate at least partially overlaps with an orthographic projection of the infrared emitter on the substrate.

In one embodiment, the infrared receiver is formed in a single layer region on the substrate.

In one embodiment, the method 700 further comprises: forming a light shielding layer on the substrate, wherein the infrared receiver is formed on the light shielding layer.

In one embodiment, the method 700 further comprises: forming a buffer layer on the substrate, wherein the buffer layer covers the light shielding layer, and the infrared receiver is formed on the buffer layer.

It should be illustrated that in the above embodiments of the present disclosure, the description is mainly made with reference to the case where the display panel is a Liquid Crystal Display (LCD) panel. However, in a case where the display panel is an Active Matrix Organic Light Emitting Diode (AMOLED) panel, the structure of the infrared receiver shown in the above embodiments may also be formed on a substrate in the AMOLED panel. The infrared receiver according to the present disclosure is formed in the TFT array substrate, and is not limited or affected by the display principle of the display panel. The difference is that there is no backlight module in the AMOLED panel, which makes the infrared emitter not be arranged in the backlight module as in the above embodiments. However, as described above, the position of the infrared emitter is not limited by the technical solutions according to the present application, and in the AMOLED panel, the infrared emitter may be located at any suitable position as long as infrared light can exit through a light emitting surface. For example, in the AMOLED panel, the infrared emitter may be embedded in the substrate or embedded in the cover glass.

The present disclosure has been described with reference to a few exemplary embodiments, and it should be understood that the terms used are illustrative and exemplary and not restrictive. Since the present disclosure may be embodied in a variety of forms without departing from the spirit or essence of the present disclosure, it is to be understood that the embodiments described above are not limited to the details described above, and should be widely explained within the spirit and scope defined by the appended claims. All changes and modifications which fall within the scope of the claims or the equivalents thereof are intended to be covered by the appended claims.

We claim:

1. A method for manufacturing a display panel, the method comprising:
    arranging a substrate;
    forming an infrared receiver in a non-display region on the substrate,
    wherein the infrared receiver is formed on one side of the substrate which is close to a light emitting surface, is configured to receive infrared light incident through the light emitting surface, and is arranged in the same layer as a gate insulating layer in a Thin Film Transistor (TFT) array,
    wherein the forming an infrared receiver comprises:
    forming a polysilicon layer in a region on the substrate where the infrared receiver is to be formed;
    forming at least one of layers of the TFT array on the substrate, wherein the at least one of the layers of the TFT array covers the polysilicon layer;
    etching a region corresponding to a first half region of the polysilicon layer to remove a film layer with a first thickness which covers the polysilicon layer;
    injecting holes into the region corresponding to the first half region of the polysilicon layer, so that the injected holes enter the first half region of the polysilicon layer;
    etching a region corresponding to a second half region of the polysilicon layer to remove a film layer with a second thickness which covers the polysilicon layer; and
    injecting electrons into the region corresponding to the second half region of the polysilicon layer, so that the injected electrons enter the second half region of the polysilicon layer.

2. The method according to claim 1, further comprising: arranging an infrared emitter, wherein the infrared emitter is configured to emit infrared light which will exit through the light emitting surface.

3. The method according to claim 2, wherein the display panel is a liquid crystal display panel, and the step of arranging the infrared emitter further comprises: arranging the infrared emitter in a backlight module of the display panel.

4. The method according to claim 1, further comprising: forming a light-passing hole in at least one of various layers between the infrared receiver and the light emitting surface, wherein an orthographic projection of the light-passing hole on the substrate at least partially overlaps with an orthographic projection of the infrared receiver on the substrate.

5. The method according to claim 2, further comprising: forming a light-passing hole in at least one of various layers between the infrared emitter and the light emitting surface, wherein an orthographic projection of the light-passing hole on the substrate at least partially overlaps with an orthographic projection of the infrared emitter on the substrate.

6. The method according to claim 1, further comprising: forming a light shielding layer on the substrate, wherein the infrared receiver is formed on the light shielding layer.

7. The method according to claim 6, further comprising: forming a buffer layer on the substrate, wherein the buffer layer covers the light shielding layer, and the infrared receiver is formed on the buffer layer.

* * * * *